US009859675B2

(12) United States Patent
Okada et al.

(10) Patent No.: US 9,859,675 B2
(45) Date of Patent: *Jan. 2, 2018

(54) LASER LIGHT-SOURCE APPARATUS AND LASER PULSE LIGHT GENERATING METHOD

(71) Applicant: SPECTRONIX CORPORATION, Ibaraki-shi, Osaka (JP)

(72) Inventors: Joji Okada, Ibaraki (JP); Yosuke Orii, Ibaraki (JP)

(73) Assignee: SPECTRONIX CORPORATION, Ibaraki-shi (JP)

( * ) Notice: Subject to any disclaimer, the term of this patent is extended or adjusted under 35 U.S.C. 154(b) by 134 days.

This patent is subject to a terminal disclaimer.

(21) Appl. No.: 15/119,005

(22) PCT Filed: Feb. 9, 2015

(86) PCT No.: PCT/JP2015/053458
§ 371 (c)(1),
(2) Date: Aug. 15, 2016

(87) PCT Pub. No.: WO2015/122374
PCT Pub. Date: Aug. 20, 2015

(65) Prior Publication Data
US 2017/0054268 A1    Feb. 23, 2017

(30) Foreign Application Priority Data
Feb. 13, 2014  (JP) .................................. 2014-025011

(51) Int. Cl.
*H01S 3/30*    (2006.01)
*H01S 3/10*    (2006.01)
(Continued)

(52) U.S. Cl.
CPC ........ *H01S 3/10007* (2013.01); *H01S 3/0085* (2013.01); *H01S 3/06716* (2013.01);
(Continued)

(58) Field of Classification Search
CPC ............. H01S 3/06716; H01S 3/06758; H01S 3/094076; H01S 3/1068; H01S 3/108;
(Continued)

(56) References Cited

U.S. PATENT DOCUMENTS

2008/0024859 A1    1/2008 Tamaoki

FOREIGN PATENT DOCUMENTS

JP    5-5912    *    1/1993
JP    H05-5912 A        1/1993
(Continued)

OTHER PUBLICATIONS

Yosuke Orii et al. "Generation of High Power Picosecond DUV Pulses by Using a Gain-Switched Semiconductor Seed Laser". Dai 60 Kai Extended Abstracts, Japan Society of Applied Physics and Related Societies, The Japan Society of Applied Physics, Mar. 2013, p. 04-127.*

(Continued)

*Primary Examiner* — Tuan Nguyen
(74) *Attorney, Agent, or Firm* — Oliff PLC

(57) ABSTRACT

A laser light-source apparatus includes: a seed light source; a fiber amplifier configured to amplify pulse light output from the seed light source based on gain switching; a solid state amplifier configured to further amplify the resultant pulse light; a nonlinear optical element configured to perform wavelength conversion on the pulse light output from the solid state amplifier; an optical switching element that is disposed between the fiber amplifier and the solid state amplifier and is configured to remove ASE noise; and a control unit. The control unit is configured to control the (Continued)

optical switching element in such a manner that propagation of light is permitted in an output period of the pulse light from the seed light source, and is stopped in a period other than the output period.

4 Claims, 6 Drawing Sheets

(51) Int. Cl.
*H01S 3/067* (2006.01)
*H01S 3/094* (2006.01)
*H01S 3/0941* (2006.01)
*H01S 3/16* (2006.01)
*H01S 3/23* (2006.01)
*H01S 3/106* (2006.01)
*H01S 3/108* (2006.01)
*H01S 5/12* (2006.01)
*H01S 3/00* (2006.01)

(52) U.S. Cl.
CPC ...... *H01S 3/06758* (2013.01); *H01S 3/09415* (2013.01); *H01S 3/094003* (2013.01); *H01S 3/094076* (2013.01); *H01S 3/108* (2013.01); *H01S 3/1068* (2013.01); *H01S 3/1611* (2013.01); *H01S 3/1618* (2013.01); *H01S 3/1666* (2013.01); *H01S 3/1673* (2013.01); *H01S 3/2316* (2013.01); *H01S 3/2333* (2013.01); *H01S 3/2375* (2013.01); *H01S 5/12* (2013.01); *H01S 3/0064* (2013.01); *H01S 3/0092* (2013.01); *H01S 2301/02* (2013.01)

(58) Field of Classification Search
CPC .... H01S 3/1666; H01S 3/1673; H01S 3/2333; H01S 3/2316; H01S 3/094073
See application file for complete search history.

(56) References Cited

FOREIGN PATENT DOCUMENTS

| JP | 2008-034532 | * | 2/2008 |
|----|-------------|---|--------|
| JP | 2008-034532 A | | 2/2008 |

OTHER PUBLICATIONS

Jul. 21, 2015 International Search Report issued in International Patent Application No. PCT/JP2015/053458.

Jul. 21, 2015 Written Opinion issued in International Patent Application No. PCT/JP2015/053458.

* cited by examiner

LASER LIGHT-SOURCE APPARATUS AND LASER PULSE LIGHT GENERATING METHOD

TECHNICAL FIELD

The present invention relates to laser light-source apparatus and a laser pulse light generating method, used for various types of laser processing.

BACKGROUND ART

In recent years, laser light is used for various types of processing. Laser light with a wavelength approximately in a range from 532 nm to 1064 nm has a high energy intensity, and are suitably used for various types of processing such as cutting or welding of metal, glass, and the like. Laser light with a wavelength in a deep ultraviolet region, which is approximately from 200 nm to 350 nm, is used for processing electronic materials and composite materials.

Laser light-source apparatus that outputs laser light with a wavelength shorter than those in a near-infrared region includes: a seed light source that outputs laser light having a wavelength in the near-infrared region; an optical amplifier that amplifies the laser light output from the seed light source; and a nonlinear optical element that converts the wavelength of the laser light, amplified by the optical amplifier, into a target wavelength.

Various optical amplifiers and the like are used for various seed light sources selected to achieve a pulse width of several hundreds of picoseconds or shorter and a frequency of several hundreds of megahertz or lower, so that a laser pulse light with large peak power is obtained.

Some conventional configurations use a mode-locked laser with a pulse rate of several tens of megahertz as such a seed light source, and pulse light of several kilohertz is obtained by dividing the frequency of the pulse light output from the seed light source.

Unfortunately, the mode-locked laser involves an oscillating frequency that is fluctuated by environmental factors such as temperature and vibration and thus is difficult to appropriately control. Thus, the frequency division needs to be synchronized with the oscillating frequency of the laser pulse light detected by using a light-receiving element and the like. Thus, a complex circuit configuration is required. Furthermore, long term stable driving is difficult to achieve because the mode-locked laser includes a saturable absorber, which is apt to degrade.

Use of a semiconductor laser that emits pulse light with a controllable oscillating frequency for the seed light source might seem like a solution. Unfortunately, the semiconductor laser is only capable of emitting near-infrared pulse light with extremely small pulse energy of several picojoules to several hundreds of picojoules. Thus, to eventually obtain the pulse light with the pulse energy of several tens of micro joules to several tens of millijoules, much stronger amplification is required than in the case where the conventional seed light source is used.

Suitable examples of the optical amplifier achieving such strong amplification include: a fiber amplifier such as an erbium-doped fiber amplifier and an ytterbium-doped fiber amplifier; and a solid state amplifier such as Nd:YAG obtained by adding neodymium to yttrium aluminum garnet and Nd:YVO4 obtained by adding neodymium to yttrium vanadate.

Patent Literature 1 and Patent Literature 2 each disclose an optical amplifier as a combination of the fiber amplifier and the solid state amplifier described above. As described in Patent Literature 1 and Patent Literature 2, the fiber amplifier and the solid state amplifier both require an excitation light source for amplifying light with the same wavelength as laser light amplified by a pumping effect in a laser active region. Generally, a semiconductor laser is used for such an excitation light source.

PRIOR ART DOCUMENTS

Patent Documents

[PTL 1] Japanese Unexamined Patent Application Publication No. 2011-192831
[PTL 2] WO2008/014331

SUMMARY OF INVENTION

Problems to be Solved by the Invention

As described above, when the semiconductor laser is used for the seed light source instead of the mode-locked laser, one or a plurality of fiber amplifiers and solid state amplifiers need to be used to obtain laser pulse light with a high energy intensity.

The amplification by the fiber amplifier in an upstream stage involves spontaneous emission noise (hereinafter, referred to as "Amplified Spontaneous Emission (ASE) Noise") superimposed on the pulse light from the seed light source. The solid state amplifier in a downstream stage amplifies pulse light having a large bandwidth as a result of a Chirping effect, self-phase modulation or Raman scattering in an optical fiber, or the like. Thus, a part of the energy of the excitation light input to the solid state amplifier, which is supposed to be used for the amplification, is wastefully used for amplifying such noise components.

Thus, amplification of pulse light to achieve a predetermined intensity requires excessive excitation energy to be input to the solid state amplifier. As a result, the energy efficiency of the solid state amplifier is low. Furthermore, a large amount of heat is emitted, requiting a large scale cooling mechanism for cooling, which increases a components cost.

When the frequency of the pulse light is in the order of megahertz or higher, the ASE noise is extremely small, and thus would not be much of a problem. On the other hand, for the pulse light the oscillating frequency of which is in a range lower than one megahertz, an influence of the ASE noise and the like needs to be fully taken into consideration.

Furthermore, pulse light with a monochromatic wave or a frequency of several hertz, which is desired to be output in some applications, is difficult to achieve due to the large energy loss attributable to the increase in the bandwidth of the pulse light on which the wavelength conversion is based and the influence of the ASE noise.

In view of the problems described above, an object of the present invention is to provide a small and relatively low cost laser light-source apparatus in which a solid state amplifier amplifies pulse light with a higher energy efficiency and lower heat emission loss.

Means for Solving the Problems

A first characteristic configuration of a laser light-source apparatus according to the present invention, for achieving the object described above, is that, as set forth in claim 1: a laser light-source apparatus including a seed light source configured to output pulse light based on gain switching; a fiber amplifier configured to amplify the pulse light output from the seed light source; a solid state amplifier configured to amplify the pulse light output from the fiber amplifier; a nonlinear optical element configured to perform wavelength conversion on the pulse light output from the solid state amplifier and output the resultant pulse light, includes an optical switching element that is disposed between the fiber amplifier and the solid state amplifier, and is configured to permit or stop propagation of light from the fiber amplifier to the solid state amplifier; and a control unit configured to execute: gain switching control processing in which the seed light source is driven at a predetermined cycle; excitation control processing in which an excitation light source of the fiber amplifier and/or the solid state amplifier is periodically or intermittently controlled in such a manner that the fiber amplifier and/or the solid state amplifier enters a population inversion state before receiving the pulse light output from the seed light source; and optical switch control processing in which the optical switching element is controlled in such a manner that the propagation of the tight is permitted in an output period of the pulse light from the seed light source, and stopped in a period other than the output period of the pulse light from the seed light source.

In the configuration described above, the control unit executes the gain switching control processing, the excitation control processing, and the optical switch control processing, and thus the solid state amplifier and the like efficiently amplifies pulse light having a frequency component contributing to the wavelength conversion by a wavelength conversion element, and heat emission loss is reduced. Thus, no large scale cooling mechanism is required, whereby a small and relatively low cost laser light-source apparatus can be obtained.

More specifically, when the gain switching control processing is executed, the seed light source is driven and the pulse light is output at the predetermined cycle. When the excitation control processing is executed, the excitation light source of the fiber amplifier and/or the solid state amplifier is periodically driven in such a manner that the fiber amplifier and/or the solid state amplifier enters the population inversion state, which is an energy state where the amplification can be performed, before receiving the pulse light. Thus, the excitation light sources are not unnecessarily driven with no pulse light received.

When the optical switch control processing is executed, the pulse light propagates from the fiber amplifier to the solid state amplifier through the optical switching element in the output period of the pulse light from the seed light source, and the propagation of the light output from the fiber amplifier to the solid state amplifier is stopped in a period other than the output period of the pulse light. In the period other than the output period of the pulse light, the ASE noise is prevented from propagating to the solid state amplifier. Thus, energy in an active region of the solid state amplifier is prevented from being wastefully consumed. Thus, the optical switching element serves as a filter that removes the ASE noise in a time domain.

As a result, a laser light-source apparatus that outputs pulse light with a monochromatic wave or a frequency of several hertz in a high energy efficiency state can be obtained.

A second characteristic configuration of the laser light-source apparatus according to the present invention is that, as set forth in claim 2: the optical switching element may include a dynamic optical element including an acousto-optic element or an electro-optic element, in addition to the first characteristic configuration described above.

As the optical switching element, an acousto-optic element that turns ON or OFF the primary diffracted light in accordance with the turning ON or OFF of an ultrasound transducer, or an electro-optic element that turns ON and OFF light with an electric field in accordance with intensity modulation through EO modulation is preferably used as the dynamic optical element.

A third characteristic configuration of the laser light-source apparatus according to the present invention is that, as set forth in claim 3: the control unit may be configured to control the seed light source and the excitation light source based on a control signal for the optical switching element, in addition to the first or second characteristic configuration described above.

Even when the response of the optical switching element is slower than the response of the seed light source and the excitation light source, the optical switching element can be driven at an appropriate timing with a control signal for controlling the seed light source generated based on the control signal for the optical switching element.

A fourth characteristic configuration of the laser light-source apparatus according to the present invention is that, as set forth in claim 4: the seed light source may include a DFB laser, and the control unit may be configured to drive the DFB laser with a frequency of several megahertz or lower and a pulse width of several hundreds of picoseconds or shorter, in addition to any of the first to third characteristic configurations described above.

When the DFB laser employing the gain switching is used as the seed light source, single longitudinal mode pulse light having a higher intensity than in a normal state can be obtained. With the gain switching, pulse light with a monochromatic wave or a desired frequency that is several megahertz or lower and having a desired pulse width that is several hundreds of picoseconds or shorter can be easily generated. By using the optical switching element described above for the pulse light, pulse light with a higher average output and a desired wavelength can be efficiently obtained.

A first characteristic configuration of a laser pulse light generating method according to the present invention is, as set forth in claim 5: a laser pulse light generating method in which pulse light output from a seed light source based on gain switching is sequentially amplified by a fiber amplifier and a solid state amplifier, subjected to wavelength conversion by a nonlinear optical element, and then is output, the method including: periodically or intermittently controlling an excitation light source of the fiber amplifier and/or the solid state amplifier in such a manner that the fiber amplifier and/or the solid state amplifier enters a population inversion state before receiving the pulse light output from the seed light source, and controlling an optical switching element, disposed between the fiber amplifier and the solid state amplifier, in such a manner that propagation of light is permitted in an output period of the pulse light from the seed light source, and stopped in a period other than the output period of the pulse light from the seed light source.

EFFECTS OF INVENTION

As described above, the present invention can provide a small and relatively low cost laser light-source apparatus in which a solid state amplifier amplifies pulse light with a higher energy efficiency and lower heat emission loss.

EMBODIMENTS FOR CARRYING OUT THE INVENTION

Figure 1:
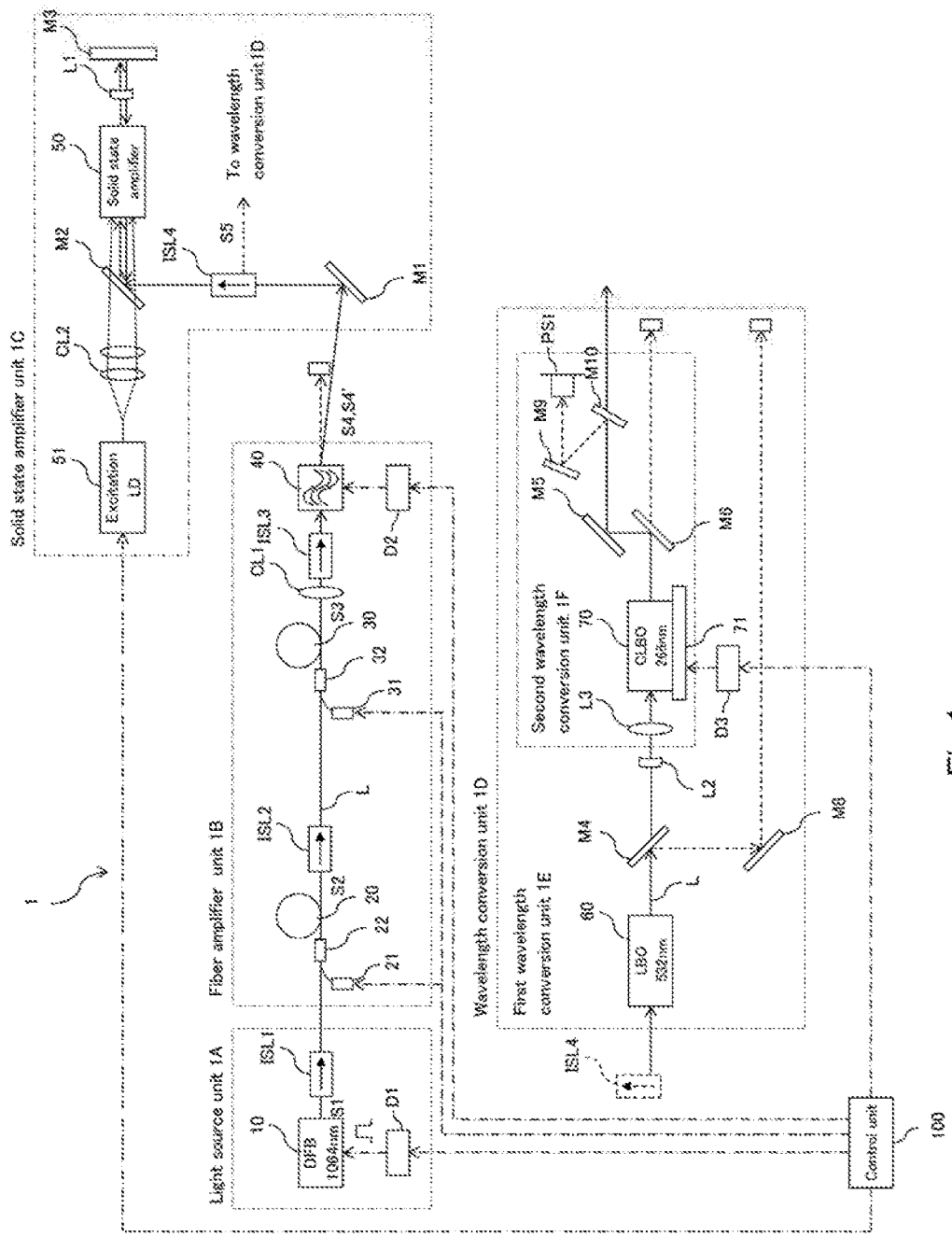
FIG. 1 is a block diagram illustrating a configuration of laser light-source apparatus.

Embodiments of laser light-source apparatus and a laser pulse light generating method according to the present invention are described. FIG. 1 illustrates an example of a configuration of a laser light-source apparatus 1 according to the present invention. The laser light-source apparatus 1 includes a light source unit 1A, a fiber amplifier unit 1B, a solid state amplifier unit 1C, and a wavelength conversion unit 1D that are arranged along an optical axis L, and further includes a control unit 100 that controls the light source unit 1A and the like.

The light source unit 1A includes a seed light source 10, a seed light source driver D1, an optical isolator ISL1, and the like. The fiber amplifier unit 1B includes: fiber amplifiers 20 and 30, in two stages, respectively including excitation light sources 21 and 31, each including a laser diode, and multiplexers 22 and 32; optical isolators ISL2 and ISL3; an optical switching element 40; and the like.

The solid state amplifier unit 1C includes a solid state amplifier 50, reflection mirrors M1, M2, and M3, a lens L1, a collimator CL2, and the like. The wavelength conversion unit 1D includes a first wavelength conversion unit 1E and a second wavelength conversion unit 1F that are respectively provided with nonlinear optical elements 60 and 70.

Laser pulse light (hereinafter, also referred to as "pulse light") with a wavelength of 1064 nm, output from the seed light source 10, is amplified by the fiber amplifiers 20 and 30 in the two stages, and then is further amplified to a predetermined level by the solid state amplifier 50 in a single stage. The pulse light amplified by the solid state amplifier 50 is subjected to wavelength conversion by the nonlinear optical element 60 to have a wavelength of 532 nm, further subjected to wavelength conversion by the nonlinear optical element 70 to have a wavelength of 266 nm, and then is output.

The number of fiber amplifiers and solid state amplifiers are not particularly limited, and may be set as appropriate to achieve a desired amplification gain for the pulse light. For example, three fiber amplifiers may be cascaded, and two solid state amplifiers may be cascaded in the subsequent stage.

A distributed feedback laser diode (hereinafter, referred to as a "DFB laser") that outputs a single longitudinal mode laser light is used for the seed light source 10. The DFB laser outputs pulse light with a monochromatic wave or a desired frequency that is several megahertz or lower and having a desired pulse width that is several hundreds of picoseconds or shorter, in response to a control signal output from the control unit 100 employing gain switching.

The pulse light, having the pulse energy of several to several hundreds of picojoules, output front the seed light source 10, is amplified by the fiber amplifiers 20 and 30 and the solid state amplifier 50 to have the final pulse energy of several tens of microjoules to several tens of millijoules. Then, the resultant pulse light is input to the two-stage nonlinear optical elements 60 and 70 to be subjected to the wavelength conversion. As a result, deep ultraviolet light with a wavelength of 266 nm is obtained.

The pulse light output from the seed light source 10 is amplified in the fiber amplifier 20 on the upstream stage, through the optical isolator ISL1. A rare-earth-doped optical fiber, such as an ytterbium (Yb)-doped fiber amplifier excited by the excitation light source 21 with a predetermined wavelength (for example 975 nm) is used for the fiber amplifiers 20 and 30. The population inversion of such a fiber amplifier 20 lasts for milliseconds, and thus energy excited by the excitation light source 21 is efficiently transferred to the pulse light having a frequency of 1 kilohertz or higher.

The pulse light that has been amplified by the fiber amplifier 20 on the upstream stage by about 30 decibels is input to the fiber amplifier 30 on the downstream stage through the optical isolator ISL2 to be amplified by about 25 decibels. The pulse light that has been amplified in the fiber amplifier 30 on the downstream stage is subjected to beam shaping by a collimator CL1, and then is guided to the solid state amplifier 50, after passing through the optical isolators ISL3 and ISL4, to be amplified by about 25 decibels.

In the present embodiment, the collimator CL1 performs the beam shaping on the pulse light output from the fiber amplifier 30 so that the beam waist is positioned right in front of the incident surface of the solid state amplifier 50, whereby efficient optical amplification is achieved despite the thermal lens effect in the solid state amplifier 50.

An Acousto-Optic Modulator (AOM) that includes an acousto-optic element and functions as the optical switching element 40 and a pair of reflection mirrors M1 and M2 are disposed between the collimator CL1 and the solid state amplifier 50. An optical isolator ISL4 that guides the pulse light amplified by the solid state amplifier 50 to the nonlinear optical element 60 is disposed between the reflection mirrors M1 and M2.

The optical isolators ISL1 to ISL4 described above are each a polarization-dependent optical isolator that blocks return light by rotating the plane of polarization to be in a reverse direction for a direction opposite to the forward direction, through the magneto-optical effect. Thus, the optical isolators ISL1 to ISL4 are disposed, for example, to prevent the optical elements disposed on the upstream side along the optical axis from breaking due to heat of the return light with a high intensity.

A solid state laser medium such as a Nd:YVO4 crystal or a Nd:YAG crystal is preferably used for the solid state amplifier 50. The solid state laser medium is excited by excitation light output from an excitation light source 51, including a laser diode that emits light having a wavelength of 808 nm or 888 nm, and then is subjected to beam shaping by the collimator CL2.

The pulse light that has passed through the optical switching element 40 enters the solid state amplifier 50 via the reflection mirrors M1 and M2 to be amplified, and then is reflected by the reflection mirror M3 to reenter the solid state amplifier 50 to be amplified again. Thus, the pulse light is amplified while passing through the solid state amplifier 50 in opposite directions. The lens L1 is for beam shaping.

The first wavelength conversion unit 1F includes a LBO crystal ($LiB_3O_5$) serving as the nonlinear optical element 60, and the second wavelength conversion unit 1F includes a CLBO crystal ($CsLiB_6O_{10}$) serving as the nonlinear optical element 70. The pulse light, with a wavelength of 1064 nm, output from the seed light source 10, is subjected to wavelength conversion in the nonlinear optical element 60 to have a wavelength of 532 nm, and then is subjected to wavelength conversion in the nonlinear optical element 70 to have a wavelength of 266 nm.

Reflection mirrors M4 and M8 function as filters for separating the pulse light having a wavelength of 1064 nm output from the nonlinear optical element 60. A reflection mirror M6 functions as a filter for separating the pulse light having a wavelength of 532 nm output from the nonlinear optical element 70. Each pulse light thus separated is attenuated by an optical damper.

The second wavelength conversion unit 1F is provided with a stage 71 serving as scanning mechanism that causes the CLBO crystal ($CsLiB_6O_{10}$) to move in a plane orthogonal to the optical axis, so that the position on the CLBO crystal ($CsLiB_6O_{10}$) irradiated with the pulse light is shifted at a predetermined timing. This is because when the same position on the CLBO crystal ($CsLiB_6O_{10}$) is irradiated with the ultraviolet ray for a long period of time, the CLBO crystal ($CsLiB_6O_{10}$) is optically damaged to have the intensity distribution and the wavelength conversion output performance degraded.

The control unit 100 includes a circuit block including a Field Programmable Gate Array (FPGA), a peripheral circuit, and the like. A plurality of logical elements are driven based on a program stored in a memory in the FPGA in advance, so that, for example, the blocks of the laser light-source apparatus 1 are sequentially controlled. The control unit 100 may employ a configuration including a microcomputer, a memory, and a peripheral circuit such as an IO or a configuration including a programmable logic controller (PLC), instead of the configuration including the FPGA.

Specifically, the control unit 100 executes gain switching control processing, excitation control processing, optical switch control processing, and the like. In the gain switching control processing, the seed light source 10 is driven in a predetermined period. In the excitation control processing, the excitation light sources 21, 31, and 51 of the fiber amplifiers 20 and 30 and the solid state amplifier 50 are periodically driven and controlled so that the fiber amplifiers 20 and 30 and the solid state amplifier 50 enter a population inversion state before receiving the pulse light output from the seed light source 10. In the optical switch control processing, the optical switching element 40 is controlled in such a manner that the propagation of light is permitted in an output period of the pulse light from the seed light source 10, and is stopped in a period other than the output period of the pulse light from the seed light source 10.

In the gain switching control processing, a trigger signal, having a predetermined pulse width, is output to the driver D1 of the DFB laser, serving as the seed light source 10, so that the seed light source 10 emits light based on gain switching. When a pulse current, corresponding to the trigger signal, is applied to the DFB laser from the driver D1, relaxation oscillation occurs. Here, a laser pulse light is output that includes only a first wave corresponding to the highest emission intensity immediately after the start of the light emission by the relaxation oscillation and includes no sub-pulses as a second wave and after. The gain switching is a method of thus generating pulse light with a short pulse width and large peak power through the relaxation oscillation.

In the excitation control processing, the excitation light sources 21, 31, and 51 are periodically or intermittently controlled to be in the population inversion state, which is an energy state where the amplification can be performed, before the fiber amplifiers 20 and 30 and the solid state amplifier 50 receive the pulse light.

Thus, the excitation light sources are not unnecessarily driven with no pulse light received, whereby the amplifiers emit less heat. In the present embodiment, the excitation light sources 21, 31, and 51 are driven earlier than an ON timing of the seed light source 10 at least by a predetermined excitation start period, and is turned OFF at an OFF timing of the seed light source 10 or when a predetermined excitation end period elapses after the ON timing of the seed light source 10.

The excitation start period is a value determined in accordance with a fluorescent lifetime of each of the amplifiers 20, 30, and 50, and is set to be a value that is 0.5 to 3 times a fluorescent lifetime τ, for example. The fluorescent lifetime differs among the amplifiers 20, 30, and 50. Thus, the driving control needs to be individually performed for the excitation light sources 21, 31, and 51 of the respective amplifiers 20, 30, and 50. To simplify the driving circuit for the excitation light sources 21, 31, and 51, the excitation start period of the amplifier with the longest fluorescent lifetime may be applied to the other amplifiers.

In the optical switch control processing, a gate signal is output to an RF driver D2 that drives the AOM serving as the optical switching element 40. A transducer (piezoelectric conversion element) that has received a high frequency signal from the RF driver D2 generates a diffraction grating in the crystal of the acousto-optic element, so that diffracted light of the pulse light that has entered the acousto-optic element is made incident on the reflection mirror M1. When the RF driver D2 is stopped, the pulse light passes through the acousto-optic element without being diffracted, and thus is not made incident On the reflection mirror M1. The light that has passed through the acousto-optic element while the RF driver D2 is stopped is attenuated by the optical damper.

When the optical switching element 40 is turned ON by the gate signal, the diffracted light, propagates to the solid state amplifier 50 from the fiber amplifier 30. When the optical switching element 40 is turned OFF by the gate signal, the propagation of the light to the solid state amplifier 50 from the fiber amplifier 30 is stopped.

The control unit 100 further executes shift control processing of controlling and thus moving, the stage 71 in a stepwise manner, so that the position of the CLBO crystal ($CsLiB_6O_{10}$) irradiated with the pulse light is shifted at a predetermined timing.

For example, in the shift control processing, the intensity of the ultraviolet light, as a result of the wavelength conversion, is monitored, and the stage 71 is moved so that the position on the CLBO crystal ($CsLiB_6O_{10}$) irradiated with the pulse light is shifted when the history of the monitored intensity matches a predetermined pattern.

The stage 71 is coupled to an X direction movement motor and/or a Y direction movement motor, controlled by the control unit 100 via a motor driver D3, in a driving force transmittable manner, and thus is movable on an X-Y plane orthogonal to the optical axis of the pulse light.

Figure 2A:
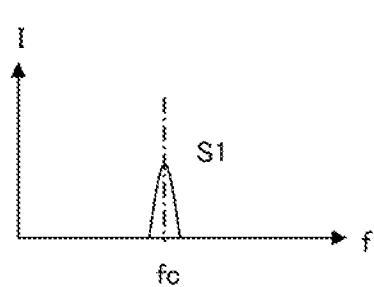
FIG. 2A is a diagram illustrating frequency and time axis characteristics of narrowband pulse light emitted from a seed light source.
Figure 2A:
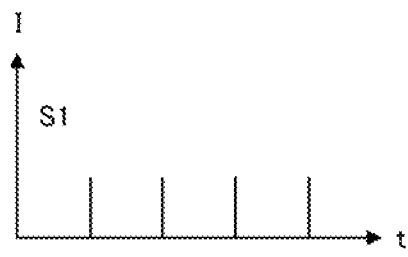
Figure 2B:
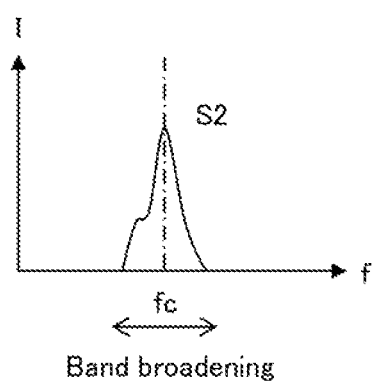
FIG. 2B is a diagram illustrating frequency and the time axis characteristics of pulse light the bandwidth of which has been increased by self-phase modulation and Raman scattering in a fiber amplifier.
Figure 2B:
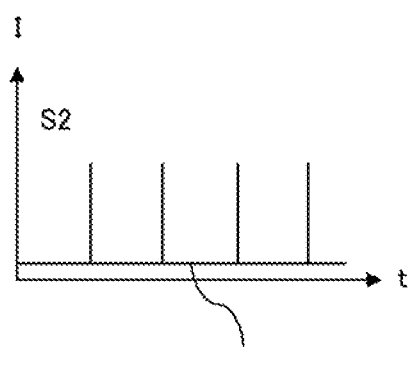
Figure 2C:
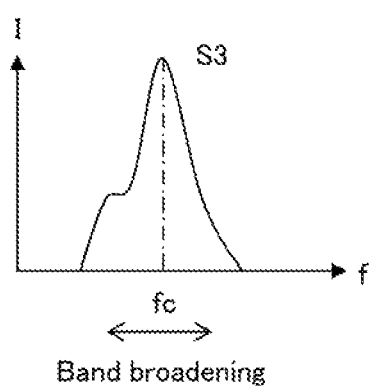
FIG. 2C is a diagram illustrating frequency and the time axis characteristics of pulse light the bandwidth of which has been increased by self-phase modulation and Raman scattering in a fiber amplifier.
Figure 2C:
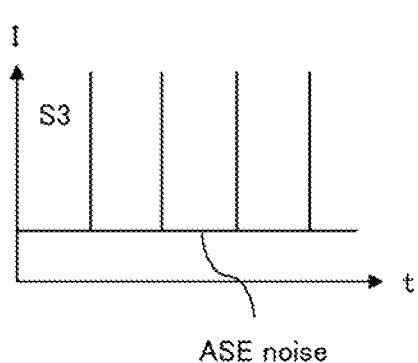

In each of FIG. 2A, FIG. 2B, and FIG. 2C, the frequency characteristics of the pulse light propagating in components of the laser light-source apparatus 1 is illustrated in a left side figure, and the time axis characteristics of the pulse light is illustrated in a right side figure. In the figures, the reference sign Sn (n is an integer) represents an optical signal Sn (n=1, 2, . . . ) from an output node of components of the laser light-source apparatus 1 illustrated in FIG. 1.

A laser pulse light having a narrow bandwidth with the center wavelength of 1064 nm (see FIG. 2A) is output from the DFB laser, serving as the seed light source 10, at a predetermined cycle, in response to the trigger signal output from the control unit 100. When the pulse light output from the seed light source 10 is guided by the fiber amplifier 20 and amplified, an unwanted spectrum width increase occurs due to self-phase modulation, Raman scattering, and the like. Furthermore, the ASE noise is produced, and thus the S/N ratio of the optical pulse is degraded (see FIG. 2B). A further increase of the bandwidth and a further increase in the ASE noise level occur (see FIG. 2C) when the pulse light is guided to and amplified by the fiber amplifier 30 on the downstream stage.

The pulse light amplified by the fiber amplifiers 20 and 30 needs to be further amplified by the solid state amplifier 50 on the downstream stage to achieve larger peak power, so that the deep ultraviolet pulse light of a predetermined intensity can be obtained. The range of wavelengths achievable by the wavelength conversion by the wavelength conversion unit 1D is limited by the characteristics of the nonlinear optical elements 60 and 70. Thus, the energy used for the amplification does not efficiently contribute to the wavelength conversion. All things considered, the wavelength conversion efficiency is low.

The excitation energy of the solid state amplifier 50 is wastefully consumed for the pulse light with an increased bandwidth and the amplified ASE noise. Thus, the energy efficiency is low. When the excitation energy is increased to offset the wastefully consumed amount, a large scale cooling device is required for preventing damages due to emitted heat on the elements. Thus, the cost of the laser light-source apparatus 1 increases. When the frequency of the pulse light is in the order of megahertz or higher, the ASE noise is so small that would not be much of a problem. The adverse effect of the ASE noise is large when the oscillating frequency of the pulse light is in a range lower than one megahertz.

Thus, in the present embodiment, the optical switching element 40 is provided that is controlled by the control unit 100 and functions as a noise filter that removes the ASE noise and the like in a time domain. The optical switching element 40 is controlled through the switch control processing described above, in such a manner that the propagation of light is permitted in the output period of the pulse light from the seed light source 10 and is stopped in a period other than the output period of the pulse light from the seed light source 10. Thus, an output permitted state is achieved where the output of the pulse light from the nonlinear optical elements 60 and 70 is permitted.

As described above, the optical switching element 40 is turned OFF in a period other than the output period of the pulse light from the seed light source 10. Thus, in the other period, the ASE noise is prevented from propagating to the solid state amplifier 50 on the downstream stage. As a result, the energy in an active region of the solid state amplifier 50 is prevented from being wastefully consumed (see a section Toff in FIG. 3D).

Figure 3A:
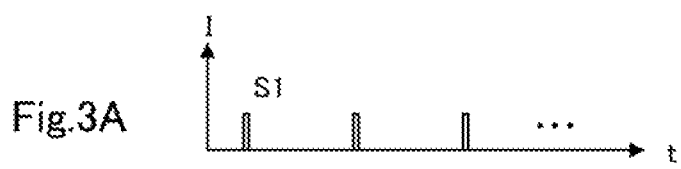
FIG. 3A is a diagram illustrating pulse light periodically emitted from the seed light source.
Figure 3B:
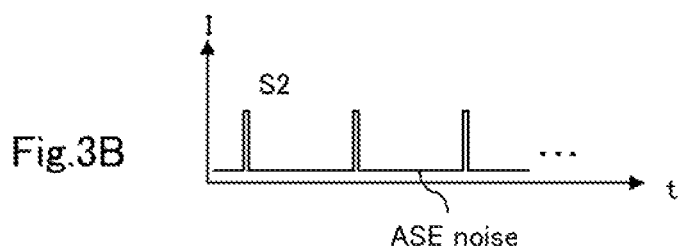
FIG. 3B is a diagram illustrating pulse light in which ASE noise has been superimposed in an upstream stage fiber amplifier.
Figure 3C:
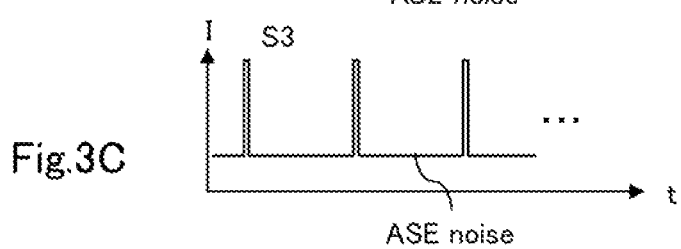
FIG. 3C is a diagram illustrating pulse light in which ASE noise has been further superimposed in a downstream stage fiber amplifier.
Figure 3D:
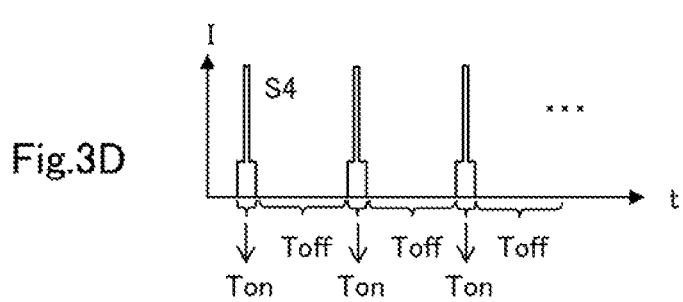
FIG. 3D is a diagram illustrating pulse light passing through an optical switching element in synchronization with an oscillation period of the seed light source in a time domain.
Figure 3E:
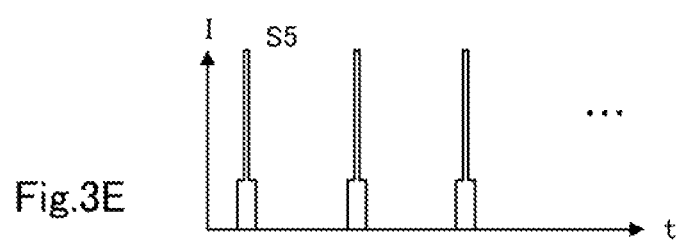
FIG. 3E is a diagram illustrating pulse light amplified by a solid state amplifier after passing through the optical switching element in synchronization with the oscillating frequency of the seed light source in the time domain.

Then, after the optical switching element 40 is turned ON by the control unit 100 in the output period of the pulse light from the seed light source 10, the pulse light propagates from the fiber amplifier 30 to the solid state amplifier 50 (see a section Ton in FIG. 3D). Thus, the pulse light is amplified with a high energy efficiency (see FIG. 3E), and the pulse light with large peak power is output from the nonlinear optical element. In this manner, the optical switching element 40 functions as a filter that removes the ASE noise in a time domain.

The "output period of the pulse light from the seed light source", in which the optical switching element 40 is ON due to the control performed by the control unit 100, is not necessarily the entire output period of the pulse light from the seed light source, and may be a part of such a period as long as the peak power of the pulse light, obtained by the wavelength conversion by the nonlinear optical element, can be within a range of appropriate values. Furthermore, the concept of the period includes short periods before and after the output period of the pulse light from the seed light source.

The "period other than the output period of the pulse light from the seed light source", in which the optical switching element 40 is OFF due to the control performed by the control unit 100, in the output permitted state is not necessarily the entire period including all the periods between the output periods of the plurality of pulse light beams, that is, periods without the pulse light, and may be a part of such periods as long as the energy in the active region of the solid state amplifier, as a result of the excitation by the excitation light source, is not largely consumed for the ASE noise.

The ASE noise removing effect of the optical switching element 40 is large when the frequency of the pulse light output from the seed light source 10 is one megahertz or lower, arid is particularly large when the frequency is several hundreds of kilohertz or lower, more particularly, 200 kilohertz or lower.

Through the excitation control processing described above, the excitation light sources 21, 31, and 51 are periodically or intermittently controlled in such a manner that the excitation light sources 21, 31, and 51 enter the population inversion state, which is an energy state where the amplification can be performed, before the fiber amplifiers 20 and 30 and the solid state amplifier 50 receive the pulse light. Thus, the excitation light sources are not unnecessarily driven with no pulse light received, whereby the amplifiers emit less heat.

The driving cycles of the excitation light sources 21, 31, and 51 are determined to be synchronized with the driving cycle of the seed light source 10, and thus the excitation light sources 21, 31, and 51 stop when the seed light source 10 stops. Thus, no large excited state achieved before the subsequent driving of the seed light source 10, whereby no giant pulse with extremely large peak power is output, which could damage the wavelength conversion device and the like with heat. Even when the seed light source 10 is periodically driven, no ASE noise is produced at least when the excitation light sources 21, 31, and 51 are OFF. Thus, the SN ratio of the pulse light does not largely degrade.

Figure 4:
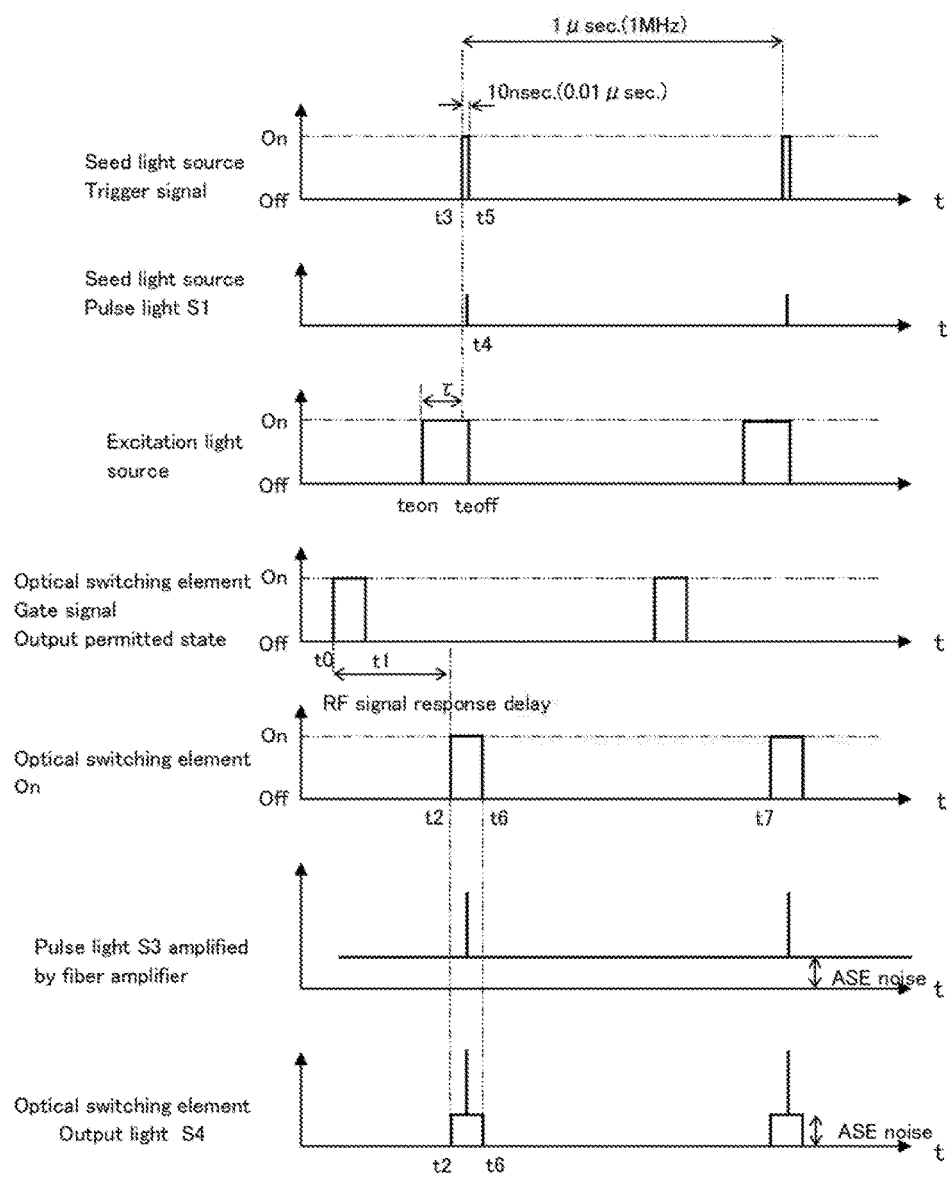
FIG. 4 is a timing chart illustrating timings for outputting a trigger signal for driving the seed light source, driving signals for excitation light sources of amplifiers, and a gate signal for driving the optical switching element.

FIG. 4 is a timing chart illustrating control performed by the control unit 100 on the seed light source 10, the excitation light sources 21, 31, and 51, and the optical switching element 40.

The control unit 100 outputs the gate signal to the RF driver D2 of the optical switching element 40 at a reference time point t0, and after a predetermined time delay, turns ON and outputs the trigger signal to the driver D1 of the seed light source 10 at a time point t3. At a time point t4, the relaxation oscillation occurs, and the trigger signal is turned OFF at a predetermined time point t5 after the time point t4. Thus, pulse light S1 with a predetermined pulse width is obtained.

A configuration where at the predetermined time point t5, the driver D1 causes the seed light source 10, in which the relaxation oscillation has occurred, to stop the laser emission may be employed instead of the configuration in which the control unit 100 turns OFF the trigger signal at the time point t5 to stop the laser emission. In such a case, the trigger signal may be turned OFF at any timing.

The control unit 100 turns ON the excitation light sources 21, 31, and 51 at a time point $t_{eon}$ that is time point later than the time point t0 by a predetermined period, and turns OFF the excitation light sources 21, 31, and 51 at a time point $t_{eoff}$ that is the OFF timing of the seed light source 10. The time point $t_{eon}$ is a time point earlier than the time point t3, at which the trigger signal is output to the seed light source 10, by the excitation start period described above, which is, in this example, a largest fluorescent lifetime τ of the fluorescent lifetimes of the amplifiers.

The pulse light S1 is amplified by the fiber amplifiers 20 and 30, and thus pulse light S3 is obtained. The pulse light S3 has an increased bandwidth and the ASE noise superimposed thereon.

The optical switching element 40 is turned ON at a time point t2 by the gate signal turned ON and output at the time point t0, and is turned OFF at a time point t6 by the gate signal turned OFF at a time point t1. Output light S4, which has been amplified by the fiber amplifier 30 and has passed through the optical switching element 40, propagates to the solid state amplifier 50 within the period between the time points t2 and t6, during which the optical switching element 40 is ON.

In other words, the output light S4, which has been amplified by the fiber amplifier 30 and has passed through the optical switching element 40, that is, pulse light S4 output from the seed light source 10 propagates to the solid state amplifier 50 within the period between the time points t2 and t6, during which the optical switching element 40 is ON. The ASE noise is prevented from propagating to the solid state amplifier 50 in the period between the time point t6 and a time point t7, during which the optical switching element 40 is OFF. Thus, the excitation energy accumulated in the active region of the solid state amplifier 50 is prevented from being wastefully consumed. The ASE noise is illustrated to be generated while the excitation light sources 21 and 31 are OFF in FIG. 4, but the production of the ASE noise is actually reduced by a certain level in such a period.

In FIG. 4, the ON state illustrated represents a state where the diffraction grating is formed in the optical switching element 40 due to the RF signal input, and thus the diffracted light propagates to the solid state amplifier 50. The OFF state illustrated represents a state where no diffraction grating is formed in the optical switching element 40, so that no light propagates to the solid state amplifier 50, and zero order light is attenuated by the damper. The control signal output to the optical switching element 40 may be a positive logic signal or may be a negative logic signal.

The ASE noise is preferably removed as much as possible in the ON period of the optical switching element 40. Thus, the ON period is set to be preferably in a range from 1.5 to 10 times, and more preferably in a range from 1.5 to 3 times the pulse width of the pulse light output from the seed light source 10. For example, when the pulse width of the pulse light output from the seed light source 10 is 50 picoseconds, the ON period is set to be in a range from 75 picoseconds to 500 picoseconds. The range of the ON period might be limited by the control cycle of the control unit 100.

In the example illustrated in FIG. 4, the control unit 100 is configured to output the trigger signal to control the seed light source 10 and the excitation light sources 21, 31, and 51, based on the control signal (gate signal) for the optical switching element 40. In such a configuration, the optical switching element 40 can be appropriately driven with the control signal for controlling the seed light source 10 generated based on the control signal for the optical switching element 40, even when the response of the optical switching element 40 is slower than that of the pulse light output from the seed light source 10.

It is a matter of course that the optical switching element 40 can be controlled based on the control signal for the seed light source 10 when the response of the optical switching element 40 is sufficiently faster than that of the pulse light output from the seed light source 10.

All things considered, the control unit 100 described above executes a laser pulse light generating method in which the excitation light source of the fiber amplifiers 20 and 30 and/or the solid state amplifier 50 is periodically or intermittently controlled so that the fiber amplifiers 20 and 30 and/or the solid state amplifier 50 enters the population inversion state before receiving the pulse light output from the seed light source 10, and the optical switching element 40 disposed between the fiber amplifier 30 and the solid state amplifier 50 is controlled in such a manner that propagation of light is permitted in the output period of the pulse light from the seed light source 10, and is stopped in a period other than the output period of the pulse light from the seed light source 10.

Figure 5A:
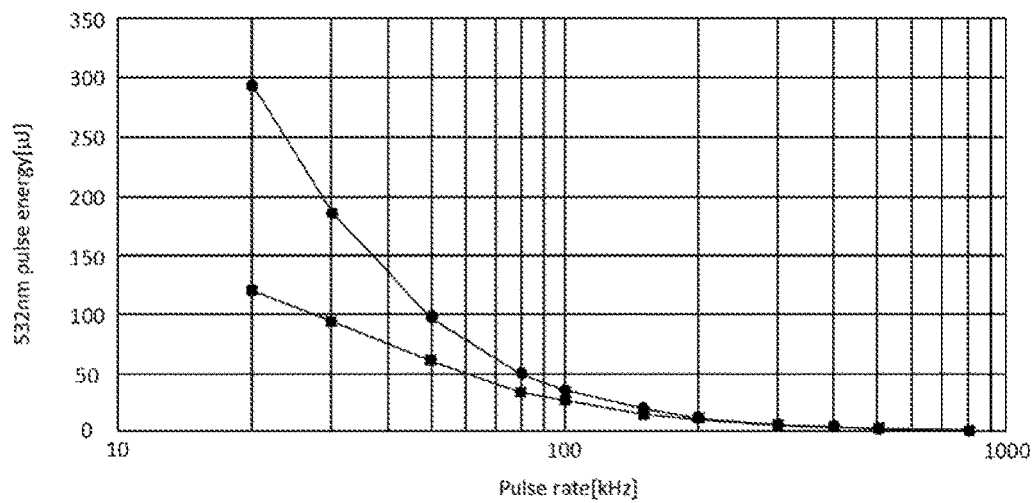
FIG. 5A is a diagram illustrating a comparison between a case where the optical switching element is used and a case where the optical switching element is not used in pulse energy characteristics after wavelength conversion.
Figure 5B:
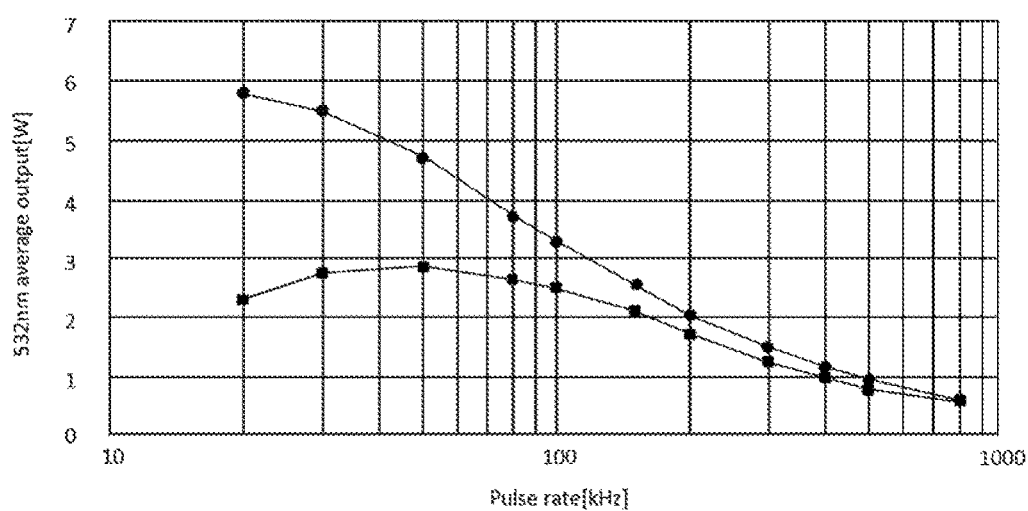
FIG. 5B is a diagram illustrating a comparison between the case where the optical switching element is used and the case where the optical switching, element is not used in average power characteristics after the wavelength conversion.

FIG. 5A illustrates pulse energy characteristics after the wave conversion in a case where an optical switching element is used that removes the ASE noise in a state where power at the tune of driving the excitation light sources 21, 31, and 51 is maintained at a constant level and a case where the optical switching element is not used. FIG. 5B illustrates average power characteristics after the wave conversion in the case where the optical switching element thin removes the ASE noise is used and the case where the optical switching element is not used. In both figures, the characteristics plotted by black circles represent the case where the optical switching element is used, and the characteristics plotted by black squares represent the case where the optical switching element is not used.

It can be seen in FIG. 5A and FIG. 5B that the pulse energy and the average power effectively increase in a frequency range from several tens of kilohertz to several megahertz, when the ASE noise is removed by using the optical switching element.

The present invention can be widely applied to laser light-source apparatuses that uses a seed light source that is driven by a frequency of several hundreds of megahertz or lower and a pulse width of several hundreds of picoseconds or shorter, as semiconductor lasers including a DFB laser.

Another embodiment of the present invention is described below.

A bandpass filter may be further provided on the downstream side of the fiber amplifiers 20 and 30 in the embodiment described above The bandpass filter reduces the bandwidth of pulse light having an increased bandwidth due to chirping effect, self-phase modulation and Raman scattering in an optical fiber, or the like.

Figure 6:
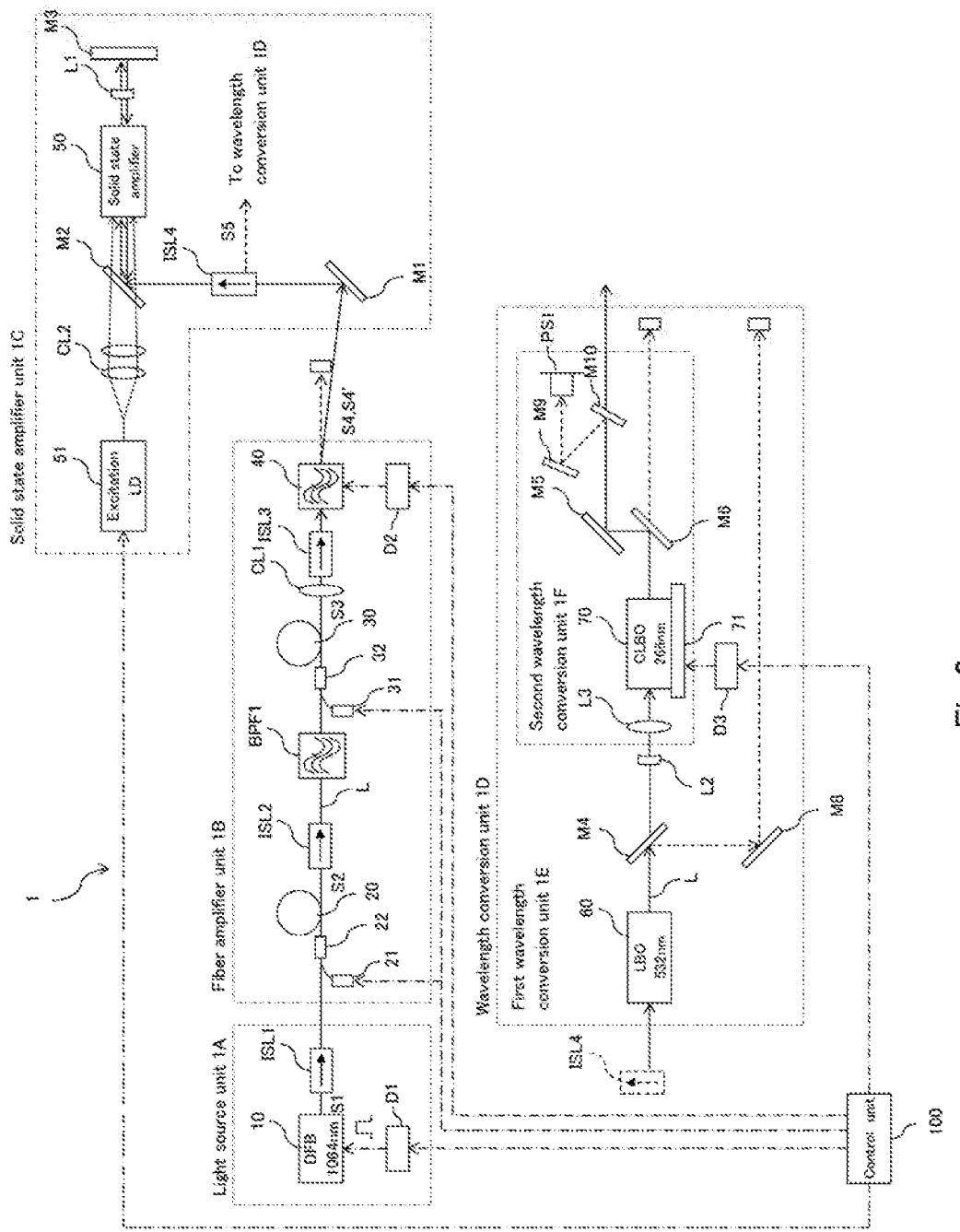
FIG. 6 is a block diagram illustrating a configuration of laser light-source apparatus according to another embodiment.

FIG. 6 illustrates an example where a bandpass filter BPF1 is provided on a downstream side of the fiber amplifier 20. The pulse light that has had a bandwidth increased while being amplified by the fiber amplifier 20 and has the ASE noise superimposed thereon is filtered by the bandpass filter BPF1. As a result, pulse light with a bandwidth narrowed by a certain level and the ASE noise removed is obtained and input to the fiber amplifier 30 on the downstream stage.

A bandpass filter may also be provided between the seed light source 10 and the optical isolator ISL1 and between the optical isolator ISL1 and the fiber amplifier 20 to prevent the ASE noise from being reflected to the seed light source.

In the embodiment described above, an example is described where the acousto-optic element that turns ON or OFF the primary diffracted light in accordance with the turning ON or OFF of the ultrasound transducer is used as the optical switching element 40. Alternatively, an electro-optic element that turns ON and OFF light with an electric field in accordance with intensity modulation through EO modulation may be used as the optical switching element 40.

An extremely small rocking mirror, made by a micromachining technique (a mirror including Micro Electro Mechanical Systems (MEMS)), may be used as the optical switching element 40. Here, the propagation of the output from the fiber amplifier 30 to the solid state amplifier 50 may be permitted or stopped by switching a rocking angle of the extremely small rocking mirror. Furthermore, a polarization device that can control transmission and blocking of light by dynamically switching a polarization state may be used. In other words, the optical switching element may include a dynamic optical element.

In the embodiment described above, an example is described where the excitation light sources 21, 31, and 51 of the respective optical amplifiers 20, 30, and 50 are driven in a period that is the same as the driving cycle of the seed light source 10. Alternatively, only the excitation light sources 21 and 31 of the respective fiber amplifiers 20 and 30 may be driven in the period that is the same as the driving cycle of the seed light source 10, and the excitation light source 51 of the solid state amplifier 50 may be continuously driven. Only the excitation light source 51 of the solid state amplifier 50 may be driven in the period that is the same as the driving cycle of the seed light source 10. In other words the excitation control processing may be configured such that the excitation light sources of the fiber amplifiers and/or the solid state amplifier may be periodically controlled in any way as long as the fiber amplifiers and/or the solid state amplifier enter the population inversion state before receiving the pulse light output from the seed light source.

For example, periodical ON/OFF control or intensity modulation control may be performed in such a manner that the optical amplifiers enter the population inversion state at the timing of receiving the pulse light output from the seed light source 10. Alternatively, the excitation light sources may be intermittently driven in a predetermined period that ends when the pulse light from the seed light source enters in such a manner that the optical amplifiers enter the population inversion state.

With the excitation light sources 21, 31, and 51 thus controlled, the excitation light is periodically or intermittently driven so that the fiber amplifiers 20 and 30 and/or the solid state amplifier 50 enters the population inversion state before receiving the pulse light output from the seed light source 10. Thus, wasteful energy consumption not contributing to the amplification of pulse light as well as beat emission can be reduced.

In the embodiment described above, an example is described where the DFB laser is used as the seed light source and employs the gain switching to generate single longitudinal mode pulse light having a higher intensity than in a normal state, in the present invention, any semiconductor laser may be used as the seed light source, and thus a general Fabry-Perot semiconductor laser other than the DFB laser may be used.

The present invention is not limited to the seed light source with an oscillation wavelength of 1064 nm. For example, seed light sources with different wavelengths, such as 1030 nm, 1550 nm, and 976 nm, may be selected as appropriate for different applications. Furthermore, these wavelengths may be used as the fundamental waves to generate harmonics, sum frequencies, and difference frequencies through the nonlinear optical element. A nonlinear optical element different from that described above may be used, For example, a BBO crystal, a KBBF crystal, an SBBO crystal, a KABO crystal, a BABO crystal, or the like may be used instead of the CLBO crystal.

Each of the plurality of embodiments described above is described as one embodiment of the present invention, and the scope of the present invention is not limited by the description. It is a matter of course that the specific circuit configurations of each component and optical elements used for circuits may be selected as appropriate or designed differently as long as the effects of the present invention are obtained.

DESCRIPTION OF SYMBOLS

1: Laser light-source apparatus
10: Seed light source
20,30: Fiber amplifier
40: Optical switching element
50: Solid state amplifier
60,70: Nonlinear optical element

The invention claimed is:
1. A laser light-source apparatus comprising:
a seed light source configured to output pulse light based on gain switching;
a fiber amplifier configured to amplify the pulse light output from the seed light source;
a solid state amplifier configured to amplify the pulse light output from the fiber amplifier;

a nonlinear optical element configured to perform wavelength conversion on the pulse light output from the solid state amplifier and output the resultant pulse light;

an optical switching element that is disposed between the fiber amplifier and the solid state amplifier, and is configured to permit or stop propagation of light from the fiber amplifier to the solid state amplifier; and a control unit configured to execute:

gain switching control processing in which the seed light source is driven at a predetermined cycle;

excitation control processing in which an excitation light source of the fiber amplifier and/or the solid state amplifier is periodically or intermittently controlled in such a manner that the fiber amplifier and/or the solid state amplifier enters a population inversion, state before receiving the pulse light output from the seed light source; and optical switch control processing in which the optical switching element is controlled in such a manner that the propagation of the light is permitted in an output period of the pulse tight from the seed light source, and stopped in a period other than the output period of the pulse light from the seed light source;

wherein the control unit is configured to control the seed light source and the excitation light source based on a control signal for the optical switching element.

2. The laser light-source apparatus according to claim 1, wherein the optical switching element includes a dynamic optical element including an acousto-optic element or an electro-optic element.

3. The laser light-source apparatus according to claim 1, wherein the seed light source includes a DFB laser, and the control unit is configured to drive the DFB laser with a frequency of several megahertz or lower and a pulse width of several hundreds of picoseconds or shorter.

4. A laser pulse light generating method in which pulse light output from a seed light source based on gain switching is sequentially amplified by a fiber amplifier and a solid state amplifier, subjected to wavelength conversion by a nonlinear optical element, and then is output, the method comprising:

a step of periodically or intermittently controlling an excitation light source of the fiber amplifier and/or the solid state amplifier in such a manner that the fiber amplifier and/or the solid state amplifier enters a population inversion state before receiving the pulse light output from the seed light source, and a step of controlling an optical switching element, disposed between the fiber amplifier and the solid state amplifier, in such a manner that propagation of light is permitted in an output period of the pulse light from the seed light source, and stopped in a period other than the output period of the pulse light from the seed light source, wherein the controlling of the excitation light source is based on a control signal for the optical switching element.

* * * * *